United States Patent
Lo et al.

(10) Patent No.: US 8,211,774 B2
(45) Date of Patent: Jul. 3, 2012

(54) METHOD FOR FORMING SEMICONDUCTOR STRUCTURE

(75) Inventors: Wen-Hsun Lo, Hsinchu County (TW); Hsing-Chao Liu, Hsinchu County (TW); Jin-Dong Chern, Taoyuan County (TW); Po-Shun Huang, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 57 days.

(21) Appl. No.: 12/562,968

(22) Filed: Sep. 18, 2009

(65) Prior Publication Data
US 2011/0070709 A1    Mar. 24, 2011

(51) Int. Cl.
*H01L 21/336* (2006.01)
(52) U.S. Cl. .................... 438/286; 438/179
(58) Field of Classification Search .......... 438/286, 438/179; 257/E21.417
See application file for complete search history.

(56) References Cited

U.S. PATENT DOCUMENTS

| 4,341,009 | A | * | 7/1982 | Bartholomew et al. | 438/286 |
| 4,904,614 | A | * | 2/1990 | Fisher et al. | 438/268 |
| 5,047,358 | A | * | 9/1991 | Kosiak et al. | 438/200 |
| 5,070,032 | A | * | 12/1991 | Yuan et al. | 438/267 |
| 5,449,637 | A | * | 9/1995 | Saito et al. | 438/227 |
| 5,591,652 | A | * | 1/1997 | Matsushita | 438/259 |
| 5,780,341 | A | * | 7/1998 | Ogura | 438/259 |

FOREIGN PATENT DOCUMENTS
CN    1186334 A    7/1998

* cited by examiner

*Primary Examiner* — Kevin M Picardat
*Assistant Examiner* — Neil Prasad

(57) ABSTRACT

The invention provides a method for forming a semiconductor structure. A substrate is provided. A conductive layer is formed on the substrate. A first patterned mask layer is formed on the conductive layer. The conductive layer exposed by the first patterned mask layer is removed to expose a first sidewall of the conductive layer. A doped region is formed in the substrate by a doping step using the first patterned mask layer as a mask. The first patterned mask layer is removed. A second patterned mask layer is formed on the conductive layer. The conductive layer exposed by the second patterned mask layer is removed to expose a second sidewall opposite to the first sidewall of the conductive layer. The second patterned mask layer is removed.

18 Claims, 6 Drawing Sheets

METHOD FOR FORMING SEMICONDUCTOR STRUCTURE

BACKGROUND OF THE INVENTION

1. Field of the Invention

The present invention relates to a method for forming a semiconductor structure.

2. Description of the Related Art

For current integrated circuit (IC) processing, controllers, memories, low-voltage (LV) circuits and high-voltage (HV) power devices are integrated into a single chip, referred to as a single-chip system. For example, to handle high voltage and current, double-diffused metal oxide semiconductor (DMOS) transistors, frequently used as conventional power devices, can operate with low on-resistance while sustaining high voltage. Lateral double-diffused metal oxide semiconductor (LDMOS) transistors in particular have a simple structure suitable for incorporation into VLSI logic circuits.

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density has generally increased while geometry size has decreased. This scaling down process generally provides benefits by increasing production efficiency and lowering associated costs.

However, IC processing and manufacturing problems arise when feature sizes continue to decrease. For example, it is more difficult to form a precisely-defined mask layer for a photolithography process.

BRIEF SUMMARY OF INVENTION

A detailed description is given in the following embodiments with reference to the accompanying drawings.

The invention provides a method for forming a semiconductor structure. A conductive layer is formed on a substrate. A first patterned mask layer is formed on the conductive layer. The conductive layer exposed by the first patterned mask layer is removed to expose a first sidewall of the conductive layer. A doped region is formed in the substrate by a doping step using the first patterned mask layer as a mask. The first patterned mask layer is removed. A second patterned mask layer is formed on the conductive layer. The conductive layer exposed by the second patterned mask layer is removed to expose a second sidewall opposite to the first sidewall of the conductive layer. The second patterned mask layer is removed.

The invention also provides a method for forming a semiconductor structure. A conductive layer is formed on a substrate. A first patterned mask layer is formed on the substrate. The conductive layer exposed by the first patterned mask layer is removed to expose a first sidewall of the conductive layer. A doped region is formed in the substrate by a vertical-doping step and an inclined-doping step using the first patterned mask layer as a mask. The doped region is extended under the conductive layer adjoined with the first sidewall. The first patterned mask layer is removed. A second patterned mask layer is formed on the conductive layer. The conductive layer exposed by the second patterned mask layer is removed to expose a second sidewall opposite to the first sidewall of the conductive layer. The second patterned mask layer is removed.

BRIEF DESCRIPTION OF DRAWINGS

The present invention can be more fully understood by reading the subsequent detailed description and examples with references made to the accompanying drawings, wherein:

FIG. 1 and FIGS. 7-11 illustrate a process flow of a method for forming a semiconductor structure of the present invention.

DETAILED DESCRIPTION OF INVENTION

Figure 1:
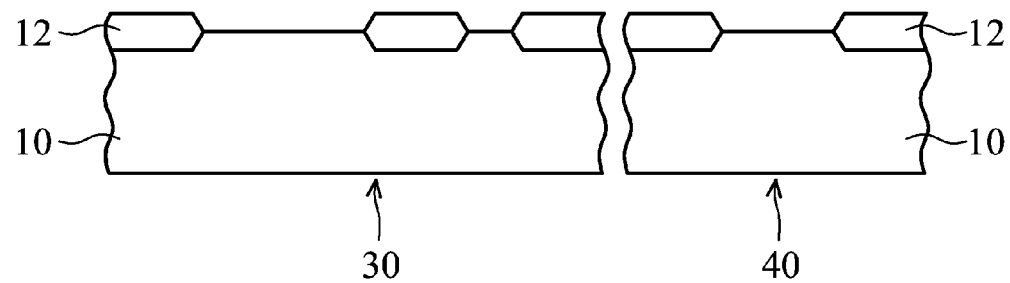
FIGS. 1-6 illustrate a conventional process flow of a method for forming a semiconductor structure known to the inventors.

Embodiments of the present invention provide a method for forming a semiconductor structure. References will be made in detail to the present embodiments, and examples of which are illustrated in the accompanying drawings. Wherever possible, the same reference numbers are used in the drawings and the descriptions to refer to the same or like parts. In the drawings, the shape and thickness of one embodiment may be exaggerated for clarity and convenience. The descriptions will be directed in particular to elements forming a part of, or cooperating more directly with, an apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

In addition, the known conventional art described in the following is not prior art for the purpose of determining the patentability of the present invention. It merely shows problems identified by the inventors.

FIGS. 1-6 illustrate a conventional process flow of a method for forming a semiconductor structure known to the inventors. Referring to FIG. 1, a substrate 10 is first provided. The substrate 10 may comprise a silicon-on-insulator (SOI) substrate, bulk silicon substrate, or substrate having a silicon epitaxy layer thereon.

Referring to FIG. 1, an isolation structure 12 may be formed in the substrate 10. In one embodiment, a patterned mask layer (not shown) exposing a portion of a first area 30 and second area 40 is formed on the substrate 10 by a photolithography process using a photomask (not shown). The mask layer may be made of a photoresist material. The photolithography process comprises processing steps of coating, exposing, developing, and removing the photoresist, etc. The photolithography process is generally understood by those skilled in the art and will not be described herein for brevity. In one embodiment, after the mask layer is formed, the substrate 10 may be selectively etched by an etch step to remove a material, such as silicon oxide or silicon nitride, on the surface of the substrate 10 exposed by the mask layer and thus exposing a silicon surface. Then, the substrate 10 exposed by the mask layer is oxidized by an oxidization step to form an isolation structure 12 of a field oxide dielectric structure as shown in FIG. 1. The isolation structure 12 is not limited to the field oxide dielectric structure. The isolation structure 12 may be formed by a conventional method comprising forming a trench in the substrate 10 exposed by the mask layer with an etch step, and filling the trench with a dielectric material such as oxide (not shown). Next, the mask layer may be removed.

Figure 2:
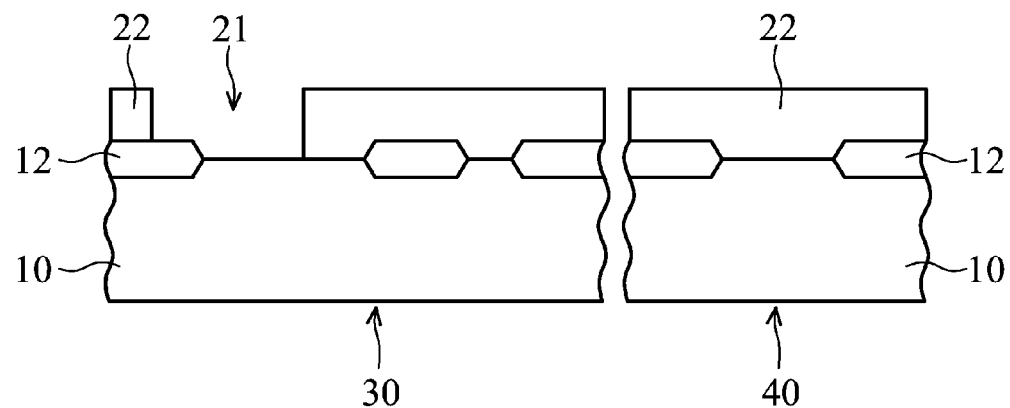

Referring to FIG. 2, a mask layer 22 may be then formed on the substrate 10. The mask layer 22 may comprise any suitable material for a hard mask such as silicon dioxide, silicon carbide, silicon nitride, or silicon oxynitride. The mask layer 22 may be formed by physical vapor deposition, chemical vapor deposition, plasma enhanced chemical vapor deposition, high-density plasma chemical vapor deposition, low-pressure chemical vapor deposition, or other suitable deposition or growth methods. In one embodiment, the mask layer 22 is a silicon oxide deposited by a reaction of silane and oxide. In other embodiments, the mask layer 22 is a silicon dioxide deposited by a reaction of tetraethoxysilane (TEOS) and ozone. In one embodiment, an opening 21 is formed in the mask layer 22 by a photolithography process using a photomask. The opening 21 may expose a portion of the substrate 10 in the first region 30. The mask layer 22 may be made of a photoresist material. The photolithography process comprises processing steps of coating, exposing, developing, and removing the photoresist, etc. The photolithography process is generally understood by those skilled in the art and is not described herein for brevity.

Figure 3:
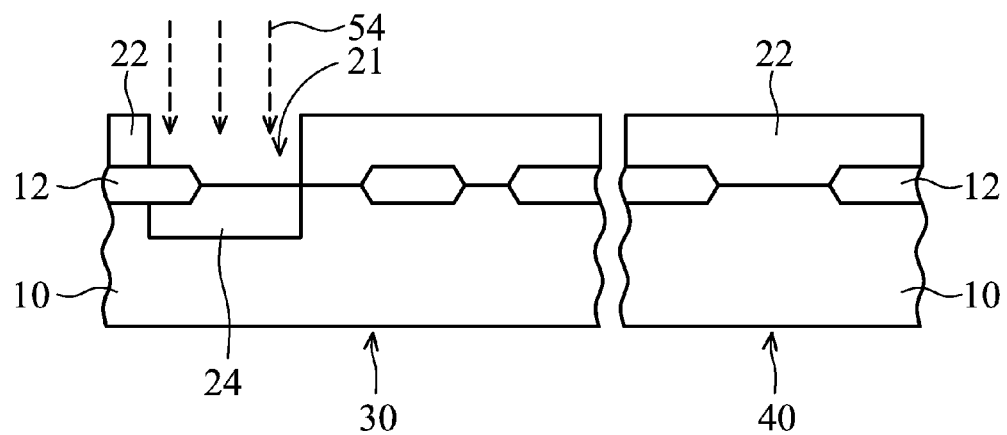

Referring to FIG. 3, a doped region 24 is then formed in the substrate 10 exposed by the opening 21 by a doping step 54 using the mask layer 22 as a mask. The dopant may be an N-type or P-type dopant. The N-type dopant comprises, for example, phosphorous, arsenic, nitrogen, antimony, or combinations thereof. The P-type dopant comprises, for example, boron, gallium, aluminum, indium, combinations thereof. The mask layer 22 is then removed.

Figure 4:
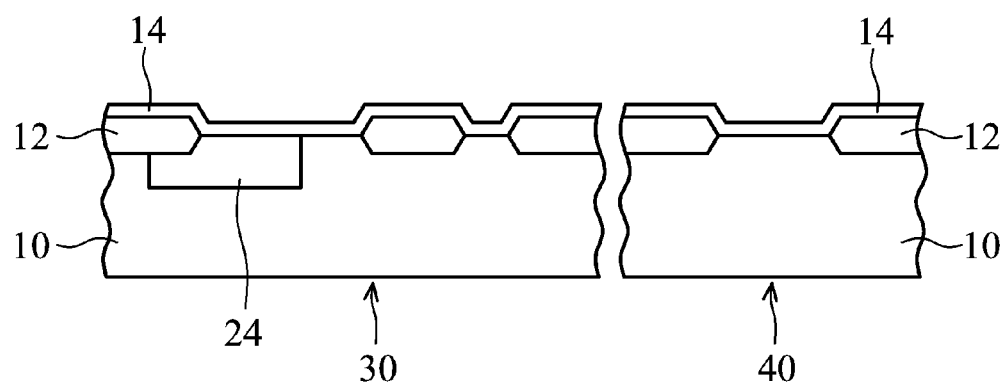

Referring to FIG. 4, a conductive layer 14 is then blanketly formed on the substrate 10. In one embodiment, the conductive layer 14 is formed with WSi. The conductive layer 14 may be other metal silicides. Materials such as polysilicon, metal, metal nitride or the like may also be used for the conductive layer 14. For example, the conductive layer 14 may comprise silicon-germanium, molybdenum, copper, tungsten, titanium, tantalum, titanium nitride, tantalum nitride, nickel silicide, cobalt silicide of metal materials, and/or other suitable conductive materials. Preferably, the conductive layer 14 is formed by a chemical vapor deposition method such as low-temperature chemical vapor deposition, low-pressure chemical vapor deposition, rapid-thermal chemical vapor deposition, plasma chemical vapor deposition, or sputtering or physical vapor deposition.

In one embodiment, the conductive layer 14 is formed on a dielectric layer (not shown). The dielectric layer may comprise an oxide formed on the substrate 10 by a thermal oxidation method. The dielectric layer comprises, for example, silicon dioxide, silicon oxynitride, silicon nitride, high-k dielectric material, or combinations thereof. The dielectric layer may also comprise one or more of materials comprising $Al_2O_3$, $HfO_2$, $HfON$, $HfSiO_4$, $ZrO_2$, $ZrON$, $ZrSiO_4$, $Y_2O_3$, $La_2O_3$, $CeO_2$, $TiO_2$, or $Ta_2O_5$. Preferably, the dielectric layer is formed by a chemical vapor deposition method such as low-temperature chemical vapor deposition, low-pressure chemical vapor deposition, rapid-thermal chemical vapor deposition, plasma chemical vapor deposition, or sputtering or physical vapor deposition.

Figure 5:
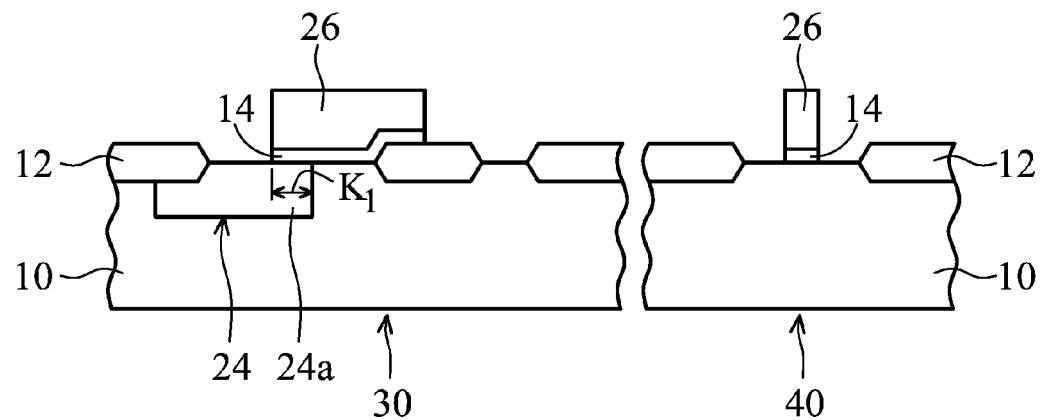

Referring to FIG. 5, then a patterned mask layer 26 may be formed on the substrate. The material and method for forming the mask layer 26 may be the same with those of the mask layer 22 shown in FIG. 2, and is not described for brevity. Next, the conductive layer 14 not protected by the mask layer 26 may be removed by an etch step, to leave the conductive layer 14 protected by the mask layer 26. The remaining conductive layer 14 may be used as a gate electrode of a gate structure. In one embodiment, the dielectric layer (not shown) under the remaining conductive layer 14 may be used as a gate dielectric layer of the gate structure. Next, the mask layer 26 is removed, and the semiconductor structure as shown in FIG. 6 is obtained.

Figure 6:
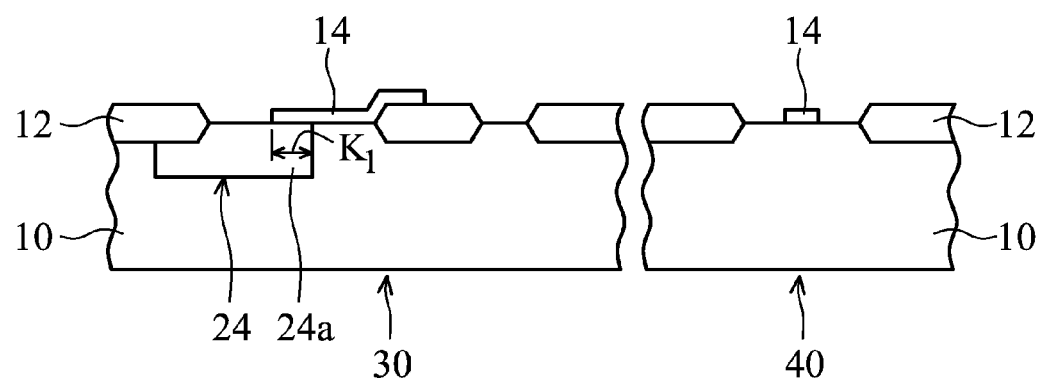

In the foregoing known art, the gate structure is formed by the method comprising forming the doped region 24 (FIG. 3) in the substrate 10 by using the patterned mask layer 22 (FIG. 2), then blanketly forming the conductive layer 14 (FIG. 4) on the substrate 10, and then patterning the conductive layer 14 by using the patterned mask layer 26 (FIGS. 5-6). The length $K_1$ of the doped region 24a extended in the substrate 10 under the gate structure 14 is decided by the opening position and opening size of the patterned mask layer 22 (FIGS. 2-3) and mask layer 26 (FIG. 5). However, the patterning step for the mask layer 22 and 26 involves the complicated and delicate photolithography process. When accuracy of the positioning and profile of the photomask or the processing parameter is shifted, even slightly, the resulting position or size of the opening of the patterned mask layer 26 is shifted. Thus, in this case, the length of the doped region 24a would not conform to a desired value, thus decreasing device efficiency. Note, that the problem is compounded when device features are shrunk. Therefore, the following embodiments of the present invention provide a method for easily and precisely forming the device structure.

FIG. 1 and FIGS. 7-11 illustrate a process flow of the method for forming the semiconductor structure of the present invention. Referring to FIG. 1, the substrate 10 is first provided. The substrate 10 may comprise a silicon-on-insulator (SOI) substrate, bulk silicon substrate, or substrate having a silicon epitaxy layer thereon. The substrate 10 may have the isolation structure 12 therein. The material and method for forming the isolation structure 12 were described previously, and are not described again for brevity.

Figure 7:
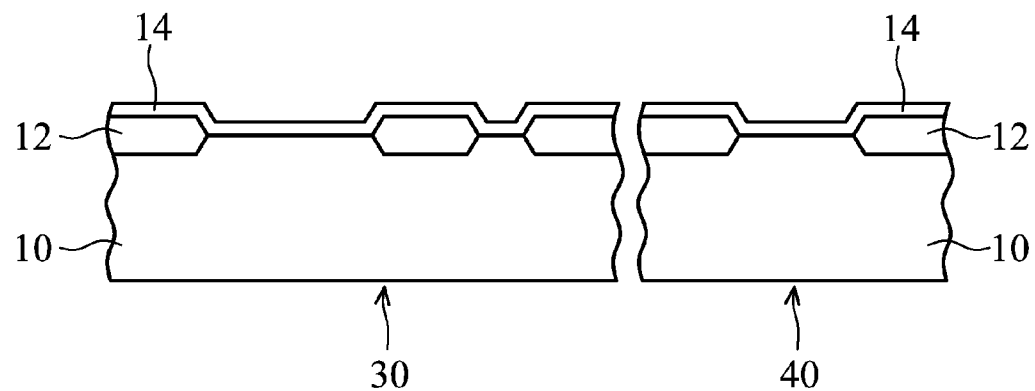

Referring to FIG. 7, the conductive layer 14 may then be blanketly formed on the substrate 10. The conductive layer 14 of FIG. 7 is similar with that of FIG. 4, and is not described again further for brevity. In one embodiment, the conductive layer 14 may be formed on the dielectric layer (not shown) as previously described.

Figure 8:
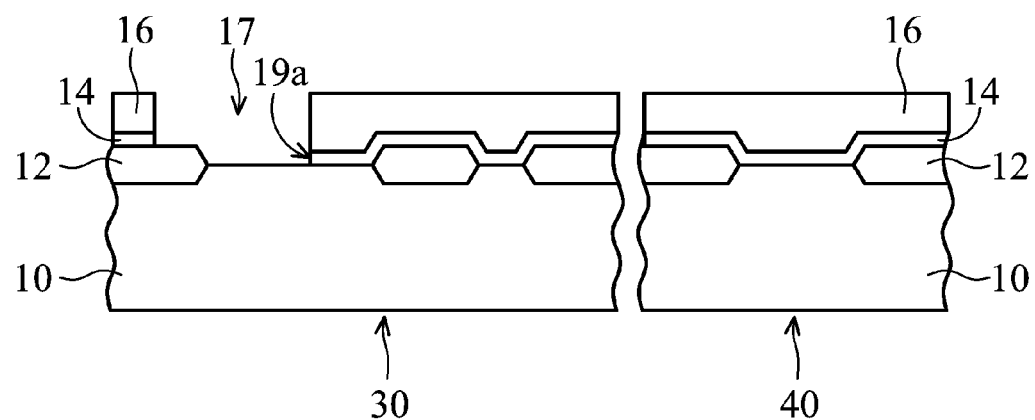

Referring to FIG. 8, a patterned mask layer 16 may be then formed on the substrate 10. The mask layer 16 may have an opening 17 therein to expose a portion of the substrate 10 in the region 30. The material and method for forming the mask layer 16 may be the same as that for forming the mask layer 22 as described in FIG. 2, and is not described again for brevity. Next, the conductive layer 14 exposed by the opening 17 is removed. In one embodiment, besides the conductive layer 14 exposed by the opening 17, the dielectric layer (not shown) under the conductive layer 14 exposed by the opening 17 is removed. It is noted that a sidewall 19a of a gate structure that will be formed in the first region 30 is defined by this removing step to substantially align the sidewall 19a with the sidewall of the mask layer 16.

Figure 9:
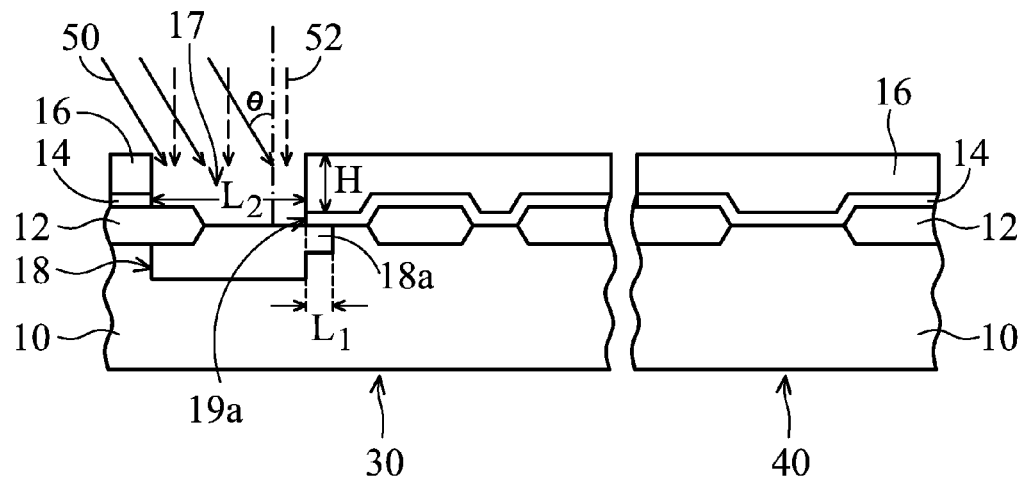

Referring to FIG. 9, next, a doped region 18 is formed in the substrate 10 by a doping step using the patterned mask layer 16 as a mask. The doping step may comprise a vertical-doping step 52 performed with a normal direction to the surface of the substrate 10, and an inclined-doping step 50 performed with a direction tilted from the normal direction with a angle θ. The doping sequence is not limited herein. In some embodiments, the vertical-doping step 52 may be performed before the inclined-doping step 50. The vertical-doping step 52 may be performed after the inclined-doping step 50. Alternatively, the vertical-doping step 52 and inclined-doping step 50 may be performed simultaneously. The dopant may be an N-type or P-type dopant. The N-type dopant comprises, for example, phosphorous, arsenic, nitrogen, antimony, or combinations thereof. The P-type dopant comprises, for example, boron, gallium, aluminum, indium, combinations thereof.

It is noted that a doped region 18a extended in the substrate 10 under the conductive layer 14 may be formed by the inclined-doping step 50. The length $L_1$ of the doped region 18a may be decided with the height H of the mask layer 16, the length $L_2$ of the opening 17, and/or the doping angle θ, energy, and/or dose of the inclined-doping step 50. Superior to the known art, the self-aligned doping process of the present invention can easily and precisely controlled the length $L_1$ of the doped region 18a, and easily improves stability of the device. Next, the mask layer 16 is removed.

Figure 10:
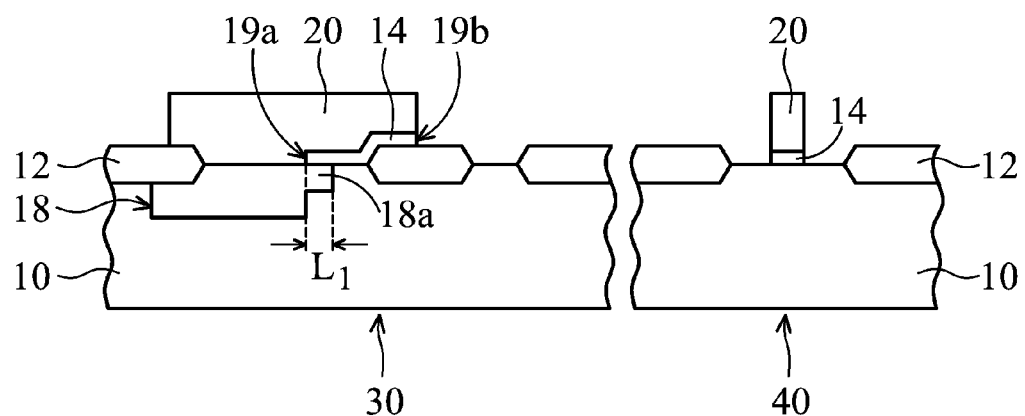

Referring to FIG. 10, next, a patterned mask layer 20 is formed on the substrate 10. The material and method for forming the mask layer 20 may be the same as that for forming the mask layer 22 as described in FIG. 2, and will not be described herein for brevity. The doped region 18 and a portion of the conductive layer 14 in the first region 30, and a portion of the conductive layer 14 in the second region 40 may be covered by the mask layer 20. Then, the conductive layer 14 not protected by the mask layer 20 may be removed by an etch step using the mask layer 20 as a mask. In one embodiment, besides the conductive layer 14 not protected by the mask layer 20, the dielectric layer (not shown) under the conductive layer 14 is removed. An opposite sidewall 19b of the gate structure formed in the first region 30 is defined by this removing step.

Figure 11:
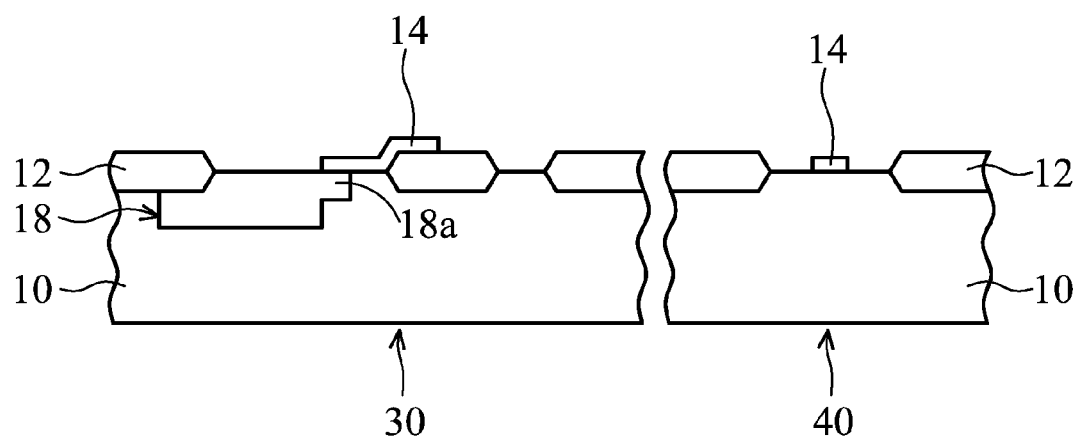

It is noted that in the first region 30, the metal layer 14 adjoined with the sidewall 19a is protected by the mask layer 20, thus the length $L_1$ of the doped region 18a previously formed is not affected during the etching of the sidewall 19b of the gate structure. Moreover, the two opposite sidewalls of the mask layer 20 used for etching the metal layer 14 may be respectively on the isolation structures 12 as shown in FIG. 10. Thus, a slight shift of the photomask or processing parameter used for patterning the mask layer 20 would not affect a final device. The fabrication process of the invention has flexibility for accuracy of the positioning and profile of the photomask and the processing parameter shifts, and is easier than conventional processes. Next, the mask layer 20 is removed, and the semiconductor structure as shown in FIG. 11 is obtained.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a semiconductor structure, comprising:
   providing a substrate;
   forming a plurality of isolation structures in the substrate;
   forming a conductive layer on the substrate and the isolation structures;
   forming a first patterned mask layer on the conductive layer;
   removing the conductive layer exposed by the first patterned mask layer to expose a first sidewall of the conductive layer, wherein the first sidewall of the conductive layer is on the semiconductor substrate;
   forming a doped region in the substrate by a doping step using the first patterned mask layer as a mask;
   removing the first patterned mask layer;
   forming a second patterned mask layer on the conductive layer;
   removing the conductive layer exposed by the second patterned mask layer to expose a second sidewall opposite to the first sidewall of the conductive layer, wherein the second sidewall of the conductive layer is on one of the isolation structures; and
   removing the second patterned mask layer.

2. The method for forming the semiconductor structure as claimed in claim 1, wherein the doping step comprises a vertical-doping step and inclined-doping step.

3. The method for forming the semiconductor structure as claimed in claim 1, wherein the doped region is extended under the conductive layer adjoined with the first sidewall.

4. The method for forming the semiconductor structure as claimed in claim 1, wherein the second patterned mask layer is extended over the doped region.

5. The method for forming the semiconductor structure as claimed in claim 1, wherein two opposite sidewalls of the second patterned mask layer are on the isolation structures.

6. The method for forming the semiconductor structure as claimed in claim 5, wherein the second patterned mask layer is extended over the doped region.

7. The method for forming the semiconductor structure as claimed in claim 1, wherein the second sidewall of the conductive layer is on the isolation structure.

8. The method for forming the semiconductor structure as claimed in claim 1, wherein the substrate comprises a first region and a second region, the first patterned mask layer exposes a portion of the conductive layer in the first region and wholly covers the conductive layer in the second region.

9. The method for forming the semiconductor structure as claimed in claim 1, wherein the substrate comprises a first region and a second region, the second patterned mask layer exposes a portion of the conductive layer in the first region and the second region.

10. The method for forming the semiconductor structure as claimed in claim 9, wherein the removing the conductive layer exposed by the second patterned mask layer exposes the second sidewall of the conductive layer in the first region, and exposes a third sidewall and a fourth sidewall opposite to the third sidewall of the conductive layer in the second region.

11. A method for forming a semiconductor structure, comprising:
    providing a substrate;
    forming a plurality of isolation structures in the substrate;
    forming a conductive layer on the substrate and the isolation structures;
    forming a first patterned mask layer on the conductive layer;
    removing the conductive layer exposed by the first patterned mask layer to expose a first sidewall of the conductive layer, wherein the first sidewall of the conductive layer is on the semiconductor substrate;
    forming a doped region in the substrate by a vertical-doping step and an inclined-doping step using the first patterned mask layer as a mask, wherein the doped region is extended under the conductive layer adjoined with the first sidewall;
    removing the first patterned mask layer;
    forming a second patterned mask layer on the conductive layer;
    removing the conductive layer exposed by the second patterned mask layer to expose a second sidewall opposite to the first sidewall of the conductive layer, wherein the first sidewall of the conductive layer is on the semiconductor substrate; and removing the second patterned mask layer.

12. The method for forming the semiconductor structure as claimed in claim 11, wherein the second patterned mask layer is extended over the doped region.

13. The method for forming the semiconductor structure as claimed in claim 11, wherein two opposite sidewalls of the second patterned mask layer are on the isolation structures.

14. The method for forming the semiconductor structure as claimed in claim 13, wherein the second patterned mask layer is extended over the doped region.

15. The method for forming the semiconductor structure as claimed in claim 11, wherein the second sidewall of the conductive layer is on the isolation structure.

16. The method for forming the semiconductor structure as claimed in claim 11, wherein the substrate comprises a first region and a second region, and the first patterned mask layer exposes a portion of the metal layer in the first region and wholly covers the metal layer in the second region.

17. The method for forming the semiconductor structure as claimed in claim 11, wherein the substrate comprises a first region and a second region, and the second patterned mask layer exposes a portion of the metal layer in the first region and the second region.

18. The method for forming the semiconductor structure as claimed in claim 17, wherein the removing the conductive layer exposed by the second patterned mask layer exposes the second sidewall of the conductive layer in the first region, and exposes a third sidewall and a fourth sidewall opposite to the third sidewall of the conductive layer in the second region.

* * * * *